(12) United States Patent
Huang et al.

(10) Patent No.: US 11,430,750 B2
(45) Date of Patent: Aug. 30, 2022

(54) SEMICONDUCTOR DEVICE PACKAGE HAVING AN ANTENNA FORMED OVER A FOAMING AGENT FILLED CAVITY IN A SUPPORT LAYER

(71) Applicant: Advanced Semiconductor Engineering, Inc., Kaohsiung (TW)

(72) Inventors: Wen Hung Huang, Kaohsiung (TW); Min Lung Huang, Kaohsiung (TW); Yuh-Shan Su, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 276 days.

(21) Appl. No.: 16/425,702

(22) Filed: May 29, 2019

(65) Prior Publication Data

US 2020/0381375 A1   Dec. 3, 2020

(51) Int. Cl.

| | |
|---|---|
| H01L 23/66 | (2006.01) |
| H01L 23/31 | (2006.01) |
| H01L 23/538 | (2006.01) |
| H01L 23/00 | (2006.01) |
| H01L 21/48 | (2006.01) |
| H01L 21/56 | (2006.01) |
| H01Q 1/22 | (2006.01) |

(52) U.S. Cl.
CPC .......... *H01L 23/66* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01Q 1/2283* (2013.01); *H01L 2223/6677* (2013.01); *H01L 2224/214* (2013.01)

(58) Field of Classification Search
CPC . H01L 23/66; H01L 23/3128; H01L 23/5383; H01L 23/5386; H01L 23/5389
See application file for complete search history.

(56) References Cited

U.S. PATENT DOCUMENTS

| | | | |
|---|---|---|---|
| 7,696,930 | B2 | 4/2010 | Akkermans et al. |
| 8,988,299 | B2 | 3/2015 | Kam et al. |
| 9,252,491 | B2* | 2/2016 | Liu .............. H01Q 1/38 |
| 9,620,847 | B2 | 4/2017 | Kamgaing |
| 11,152,315 | B2* | 10/2021 | Chang ............. H01L 24/10 |
| 2010/0164783 | A1* | 7/2010 | Choudhury .......... H01Q 21/065 342/175 |
| 2016/0218072 | A1* | 7/2016 | Liao ............... H01L 23/49816 |
| 2019/0280374 | A1* | 9/2019 | Kim ................. H01L 21/568 |

\* cited by examiner

*Primary Examiner* — Anh D Mai
(74) *Attorney, Agent, or Firm* — Foley & Lardner LLP (57) ABSTRACT

A semiconductor device package includes a first substrate, an antenna, a support layer, a dielectric layer and a second substrate. The first substrate has a first surface and a second surface opposite to the first surface. The antenna element is disposed on the second surface of the first substrate. The support layer is disposed on the first surface of the first substrate and at the periphery of the first surface of the first substrate. The support layer has a first surface facing away from the first substrate. The dielectric layer is disposed on the first surface of the support layer and spaced apart from the first substrate. The dielectric layer is chemically bonded to the support layer. The second substrate is disposed on a first surface of the dielectric layer facing away from the support layer.

15 Claims, 14 Drawing Sheets

SEMICONDUCTOR DEVICE PACKAGE HAVING AN ANTENNA FORMED OVER A FOAMING AGENT FILLED CAVITY IN A SUPPORT LAYER

BACKGROUND

1. Technical Field

The present disclosure relates to a semiconductor device package and a method of manufacturing the same, and more particularly to a semiconductor device package including an antenna and a method of manufacturing the same.

2. Description of the Related Art

The development of mobile communication has caused demand for high data rates and stable communication quality, and high frequency wireless transmission (e.g., 28 GHz or 60 GHz) has become one of the most important topics in the mobile communication industry. In order to achieve such high frequency wireless transmission, the signal can be transmitted in a band having wavelengths from about ten to about one millimeter ("millimeter wave," or "mmWave"). However, the signal attenuation is one of the problems in millimeter wave transmission.

SUMMARY

In accordance with some embodiments of the present disclosure, a semiconductor device package includes a first substrate, an antenna, a support layer, a dielectric layer and a second substrate. The first substrate has a first surface and a second surface opposite to the first surface. The antenna element is disposed on the second surface of the first substrate. The support layer is disposed on the first surface of the first substrate and at the periphery of the first surface of the first substrate. The support layer has a first surface facing away from the first substrate. The dielectric layer is disposed on the first surface of the support layer and spaced apart from the first substrate. The dielectric layer is chemically bonded to the support layer. The second substrate is disposed on a first surface of the dielectric layer facing away from the support layer.

In accordance with some embodiments of the present disclosure, a semiconductor device package includes a first substrate, an antenna element, a second substrate and a foaming agent. The first substrate has a first surface and a second surface opposite to the first surface. The antenna element is disposed on the second surface of the first substrate. The second substrate is disposed on the first substrate. The first substrate and the second substrate define a cavity. The foaming agent is disposed within the cavity.

In accordance with some embodiments of the present disclosure, a method of manufacturing a semiconductor device package includes (a) precuring a first photosensitive element on a first substrate; (b) precuring a second photosensitive element on a second substrate; (c) attaching the first photosensitive element to the second photosensitive element; and (d) full curing the first photosensitive element and the second photosensitive element.

Common reference numerals are used throughout the drawings and the detailed description to indicate the same or similar components. The present disclosure will be readily understood from the following detailed description taken in conjunction with the accompanying drawings.

DETAILED DESCRIPTION

Figure 1:
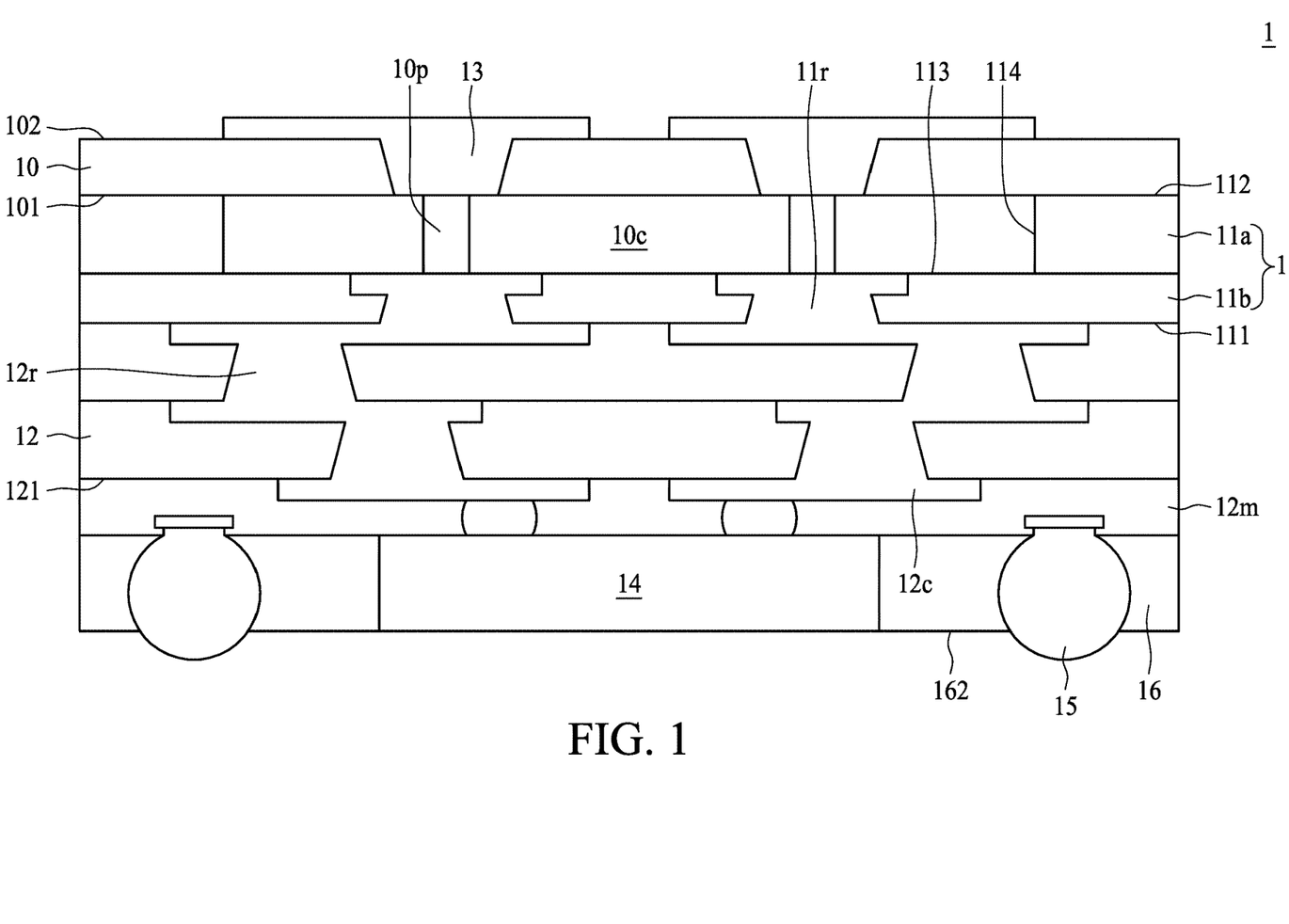
FIG. 1 illustrates a cross-sectional view of a semiconductor device package in accordance with some embodiments of the present disclosure.

FIG. 1 illustrates a cross-sectional view of a semiconductor device package 1 in accordance with some embodiments of the present disclosure. The semiconductor device package 1 includes substrates 10, 12, a dielectric layer 11, an antenna element 13, an electronic component 14, electrical contacts 15 and a package body 16.

The substrate 10 may be, for example, a printed circuit board, such as a paper-based copper foil laminate, a composite copper foil laminate, or a polymer-impregnated glass-fiber-based copper foil laminate. In some embodiments, the substrate 10 may be a single-layer substrate or multi-layer substrate. The substrate 10 has a surface 101 and a surface 102 opposite to the surface 101.

The antenna pattern 13 is disposed on the surface 102 of the substrate 10. In some embodiments, the antenna pattern 13 penetrates the substrate 10 and is exposed from the surface 101 of the substrate 10. In some embodiments, the antenna pattern 13 includes a plurality of antenna elements. For example, the antenna pattern 13 may include an array of antenna elements. In some embodiments, the antenna pattern 13 may include an M×N array of antenna elements, where M and N are integers greater than 0. In some embodiments, the antenna pattern 13 is formed of or includes gold (Au), silver (Ag), copper (Cu), platinum (Pt), Palladium (Pd), other metal(s) or alloy(s), or a combination of two or more thereof.

The dielectric layer 11 is disposed on the surface 101 of the substrate 10. The dielectric layer 11 has surfaces 111, 112, 113 and 114. The surface 111 faces away from the substrate 10. The surface 112 connected to the surface 101 of the substrate 10. The surface 113 faces the substrate 10 and is spaced apart from the substrate 10. The surface 114 is extended between the surface 112 and the surface 113. The dielectric layer 11 has a portion 11a (also can be referred to as "support element") disposed on the surface 101 of the substrate 10 and a portion 11b disposed on the portion 11a. In some embodiments, the portion 11a of the dielectric layer 11 is chemically bonded to the portion 11b of the dielectric layer 11. The portion 11a is disposed at the periphery of the surface 101 of the substrate 10. In some embodiments, the dielectric layer 11 and the substrate 10 define a cavity 10c (or a chamber). For example, the portion 11b of the dielectric layer 11 defines an upper portion of the cavity 10c, the substrate 10 defines a lower portion of the cavity 10c, and the portion 11a of the dielectric layer 11 defines a sidewall of the cavity 10c. For example, the surface 113 of the dielectric layer 11 defines an upper surface of the cavity 10c, the surface 101 of the substrate 10 defines a lower surface of the cavity 10c, and the surface 114 of the dielectric layer 11 defines the sidewall of the cavity 10c.

The dielectric layer 11 may include a conductive layer 11r disposed therein. In some embodiments, the conductive layer 11r penetrates the portion 11b of the dielectric layer 11 and is exposed from the surface 111 and the surface 113 of the dielectric layer 11 for electrical connections. A conductive element 10p (e.g., copper pillar) is disposed within the cavity 10c and electrically connects the antenna pattern 13 to the conductive layer 11r. The conductive element 10p is, or includes, a conductive material such as a metal or metal alloy. Examples of the conductive material include Au, Ag, Cu, Pt, Pd, or an alloy thereof. In some embodiments, the conductive element 10p may be omitted, and signal can be transmitted between the antenna pattern 13 and the conductive layer 11r through coupling.

In some embodiments, the dielectric layer 11 includes a photosensitive material. For example, the dielectric layer 11 includes expanded polyolefin (EPO), solder resist, polyimide (PI), epoxy and/or polybenzoxazole (PBO). In some embodiments, the portion 11a and the portion 11b of the dielectric layer 11 are formed of the same material. Alternatively, the portion 11a and the portion 11b of the dielectric layer 11 are formed of different materials.

The substrate 12 is disposed on the surface 111 of the dielectric layer 11. The substrate 12 may be, for example, a printed circuit board, such as a paper-based copper foil laminate, a composite copper foil laminate, or a polymer-impregnated glass-fiber-based copper foil laminate. The substrate 12 may include an interconnection structure 12r, such as a redistribution layer (RDL) or a grounding element. In some embodiments, a portion of the interconnection structure 12r is exposed from the substrate 12 to be electrically connected to the conductive layer 11r of the dielectric layer 11. The interconnection structure 12r is, or includes, a conductive material such as a metal or metal alloy. Examples of the conductive material include Au, Ag, Cu, Pt, Pd, or an alloy thereof. In some embodiments, the substrate 12 may be a single-layer substrate or multi-layer substrate which includes a core layer and a conductive material. The conductive material and/or structure may include a plurality of traces. The substrate 12 may include one or more conductive pads 12c in proximity to, adjacent to, or embedded in and exposed at a surface 121 of the substrate 12. The substrate 12 may include a solder resist 12m (or solder mask) on the surface 121 of the substrate 12 to fully expose or to expose at least a portion of the conductive pads 12c for electrical connections. For example, the solder resist 12m may cover a portion of the conductive pads 12c.

The electronic component 14 is disposed on the surface 121 of the substrate 12 and electrically connected to the conductive pads 12c of the substrate 12. The electronic component 14 may be an active electronic component, such as an integrated circuit (IC) chip or a die. In some embodiments, the conductive pads 12c are directly connected to conductive terminals (e.g., copper pillars) of an active surface of the electronic component 14. In other embodiments, the electronic component 14 may be electrically connected to the substrate 12 by way of flip-chip or wire-bond techniques.

The electrical contacts 15 are disposed on the substrate 12 (e.g., on the conductive pads of the substrate 12) to provide electrical connections between the semiconductor device package 1 and any other circuit boards (e.g., substrate, PCB, motherboard or the like) or circuits. In some embodiments, the electrical contacts 15 are solder balls or conductive pillars.

The package body 16 is disposed on the substrate 12 and covers or encapsulates a portion of the electronic component 14 and the electrical contacts 15. The back surface of the electronic component 14 is exposed from the package body 16. In some embodiments, the back surface of the electronic component 14 is substantially coplanar with a surface 162 of the package body 16. A portion of the electrical contacts 15 is exposed from the package body 16 for electrical connections. In some embodiments, the package body 16 includes an epoxy resin having fillers, a molding compound (e.g., an epoxy molding compound or other molding compound), a polyimide, a phenolic compound or material, a material with a silicone dispersed therein, or a combination thereof.

As shown in FIG. 1, since the dielectric layer 11 and the substrate 10 are arranged to define a height, a distance, a cavity (e.g. an air cavity) or cavities therebetween, a gain, bandwidth and radiation efficiency of the antenna pattern 13 can be improved. In some embodiments, the cavity 10c may be a vacuum cavity (or a vacuum chamber) or a near-vacuum cavity, which can prevent the delamination between the substrate 10 and the dielectric layer 11 or the substrate 12 due to the expansion of the air during the thermal process and in turn to increase the reliability of the semiconductor device package 1.

Figure 2:
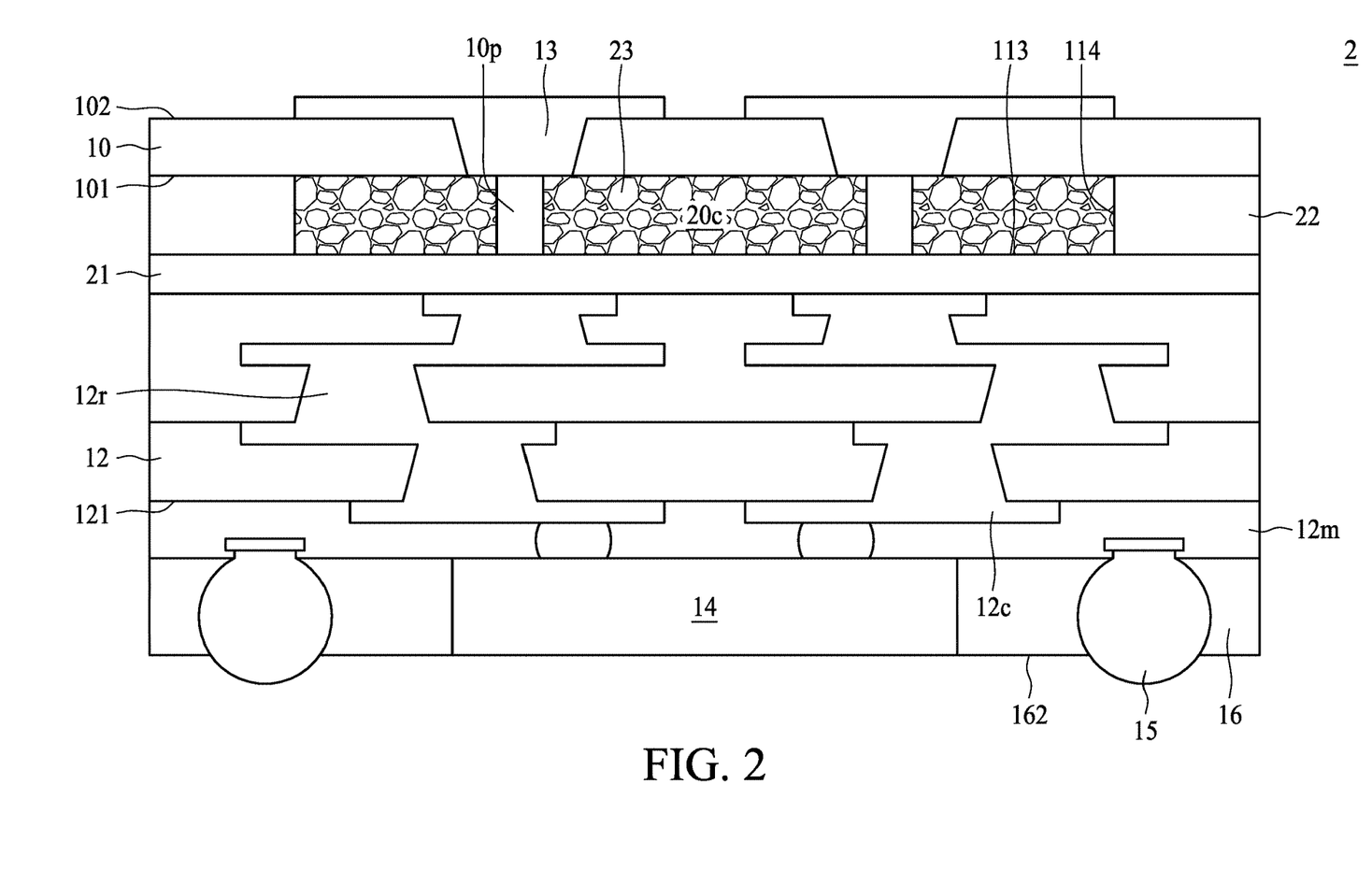
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1 and the differences therebetween are described below.

A support structure 22 is disposed on the surface 101 of the substrate 10. The support structure 22 is disposed at the periphery of the surface 101 of the substrate 10. The support structure 22, the substrate 10 and the substrate 12 define a cavity 20c. In some embodiments, the support structure 22 can be the dielectric layer 11 as shown in FIG. 1. Alternatively, the support structure 22 may be or include any other suitable materials, such as solder resist. The support structure 22 is connected to the substrate 12 through an adhesion layer 21 (e.g., die attach film (DAF) or tape). In some embodiments, the conductive element 10p may penetrate the adhesion layer 21 to electrically connect to the interconnection structure 12r. In some embodiments, the adhesion layer 21 may include a conductive material. For example, at least a portion (e.g., the portion corresponds to the conductive element 10) of the adhesion layer 21 is electrically conductive to provide electrical connections between the substrate 12 and the conductive element 10p.

A foaming agent 23 is disposed within the cavity 20c. The foaming agent 23 is surrounded by the support structure 22. In some embodiments, the foaming agent 23 is formed of or includes a material having a dielectric constant (Dk) and a dissipation factor (Df) less than Dk and DF of dielectric materials. For example, Dk of the foaming agent 23 is equal to or less than 3, and Df of the foaming agent 23 is equal to or less than 0.001.

In accordance with the embodiments in FIG. 2, since the Dk and Df of the forming agent 23 is less than those of dielectric materials, the gain, bandwidth and radiation efficiency of the antenna pattern 13 can be improved. In addition, the foaming agent 23 is disposed within the cavity 20c to cover air within the cavity 20c, which can prevent the delamination between the substrate 10 and the support structure 22 or the substrate 12 due to the expansion of the air during the thermal process and in turn to increase the reliability of the semiconductor device package 2.

FIG. 3A, FIG. 3B, FIG. 3C, FIG. 3D, FIG. 3E and FIG. 3F illustrate a semiconductor manufacturing method in accordance with some embodiments of the present disclosure.

Figure 3A:
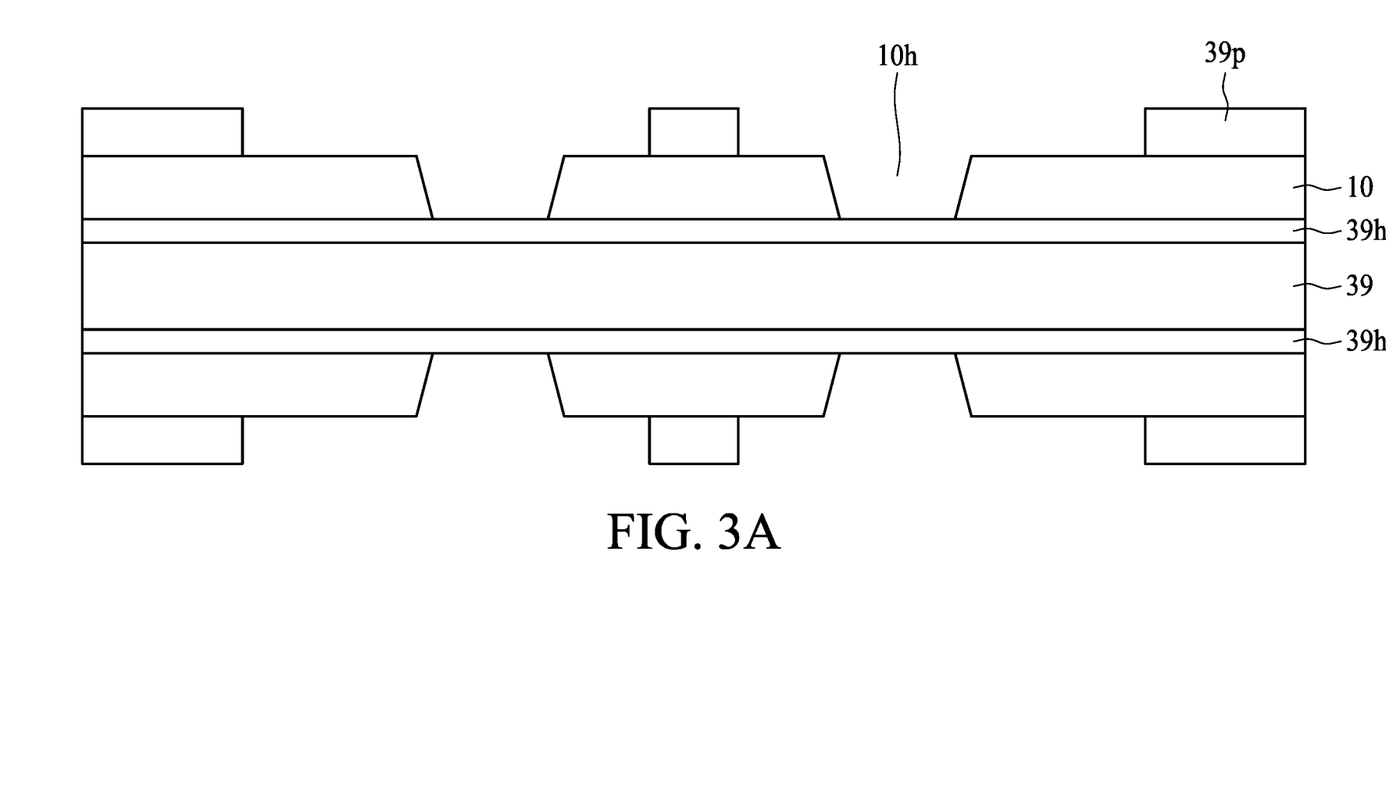
FIG. 3A, FIG. 3B, FIG. 3C, FIG. 3D, FIG. 3E and FIG. 3F illustrate a semiconductor manufacturing method in accordance with some embodiments of the present disclosure.

Referring to FIG. 3A, a carrier 39 with adhesion layers 39h is provided. Substrates 10 are disposed on both surfaces of the carrier 39. In some embodiments, the substrates 10 may be disposed by, for example, lamination. One or more openings 10h are formed to penetrate the substrates 10 to expose a portion of the carrier 39 (or the adhesion layers 39h). In some embodiments, the openings 10h can be formed by, for example, drilling, etching or any other suitable processes. A patterned photoresist 39p (or photomask) is then disposed on the substrates 10.

Figure 3B:
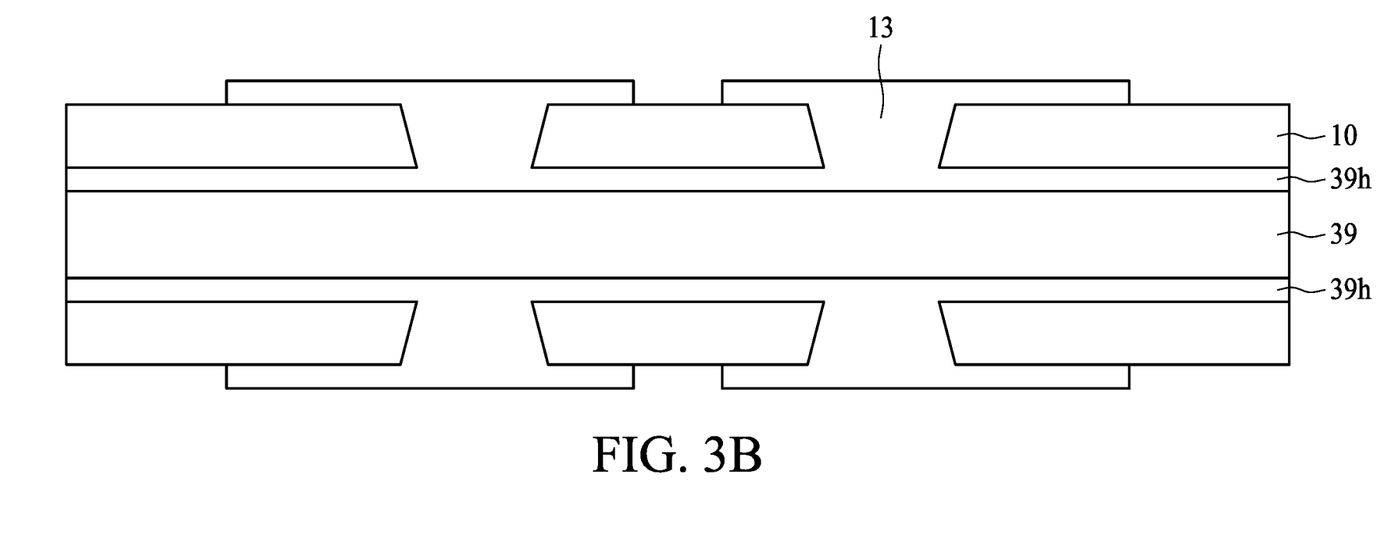

Referring to FIG. 3B, an antenna pattern 13 is formed on the substrates 10 and within the openings 10h. In some embodiments, the antenna pattern 13 is defined by the patterned photoresist 39p. For example, the antenna pattern 13 is formed at the location that is exposed from the patterned photoresist 39p. In some embodiments, the antenna pattern 13 is formed by, for example, wet process or any other suitable processes. The photoresist 39p is then removed.

Figure 3C:
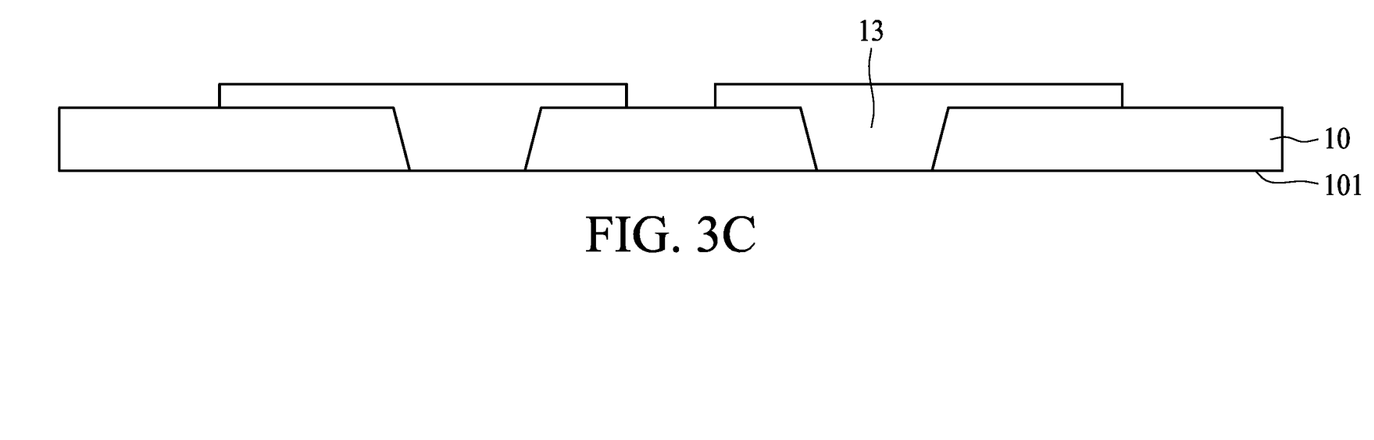

Referring to FIG. 3C, the carrier 39 and the adhesion layer 39h are removed from the substrates 10 to expose a surface 101 of the substrate 10 and a portion of the antenna pattern 13.

Figure 3D:
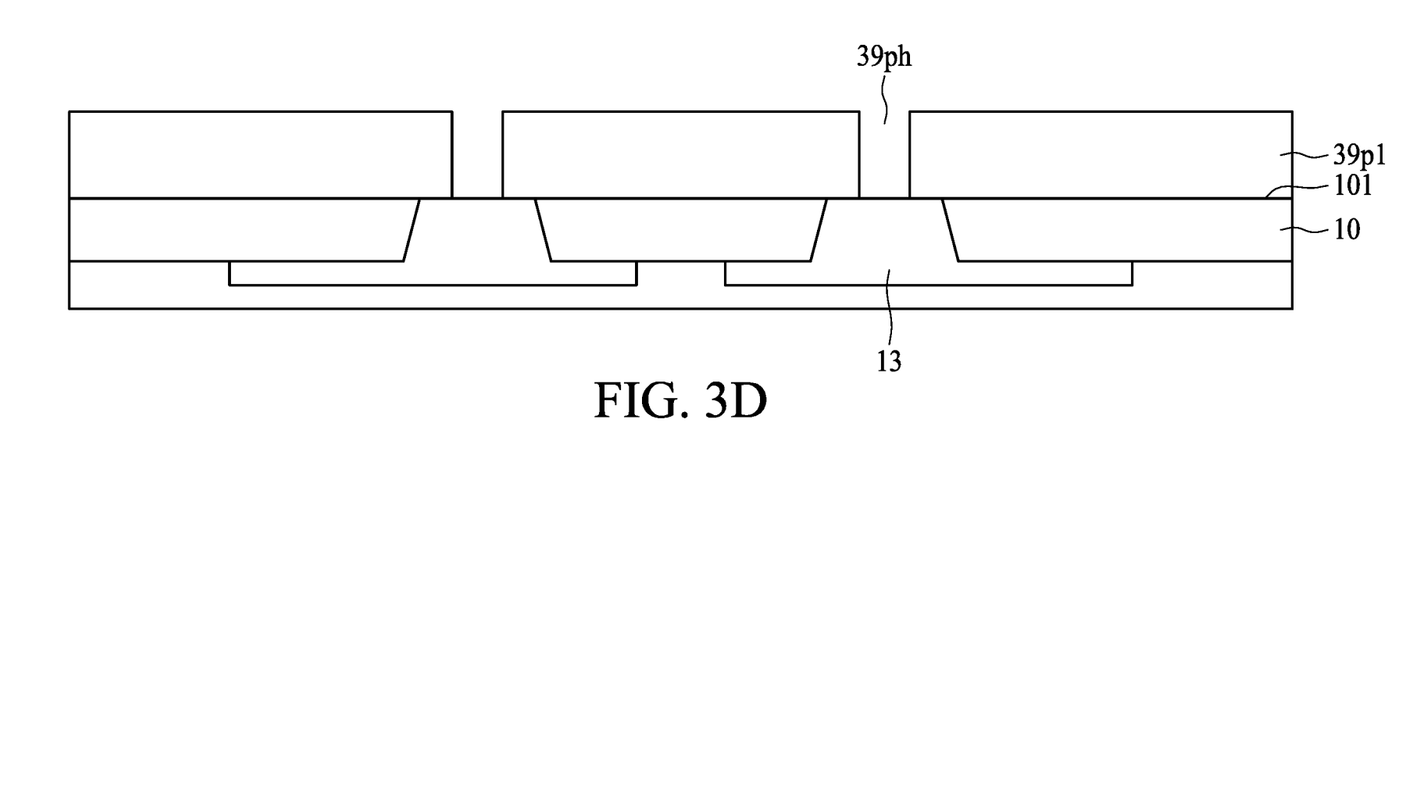

Referring to FIG. 3D, a patterned photoresist 39p1 (or photomask) is disposed on the surface 101 of the substrate 10. The patterned photoresist 39p1 has one or more openings 39ph to expose the antenna pattern 13.

Figure 3E:
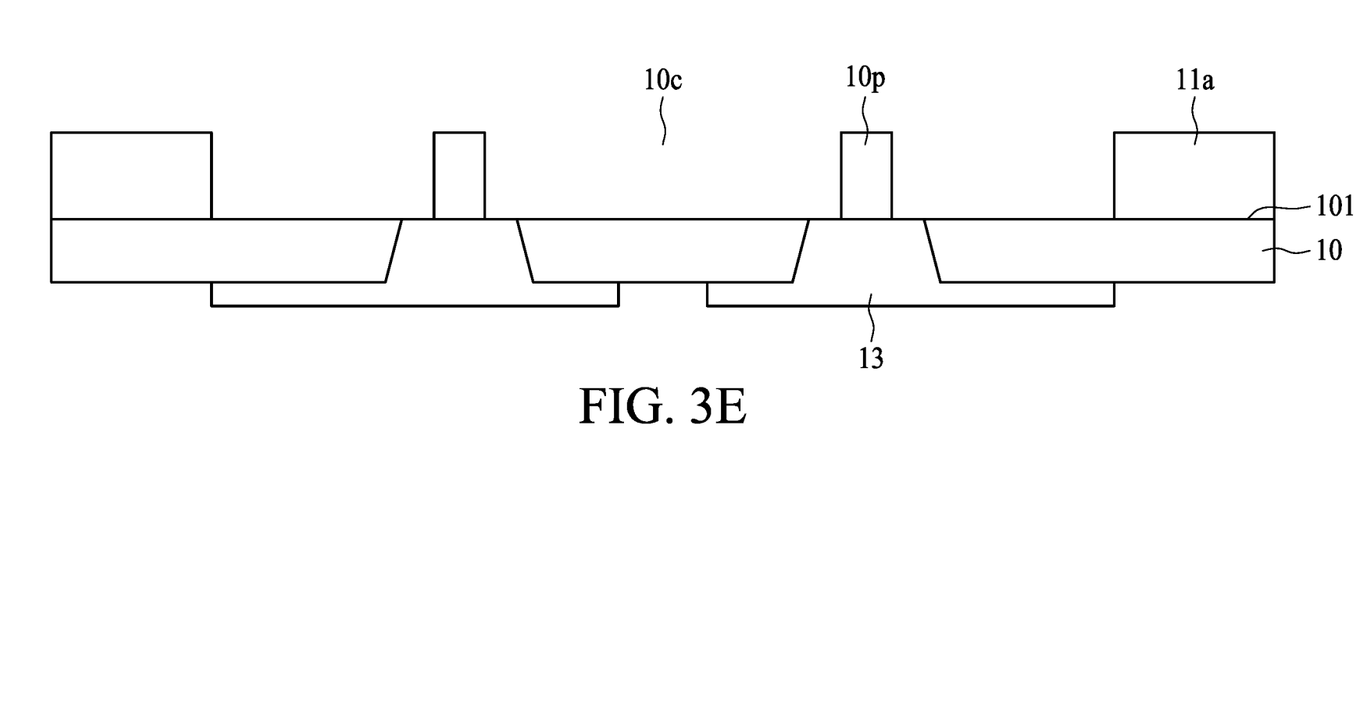
Figure 3F:
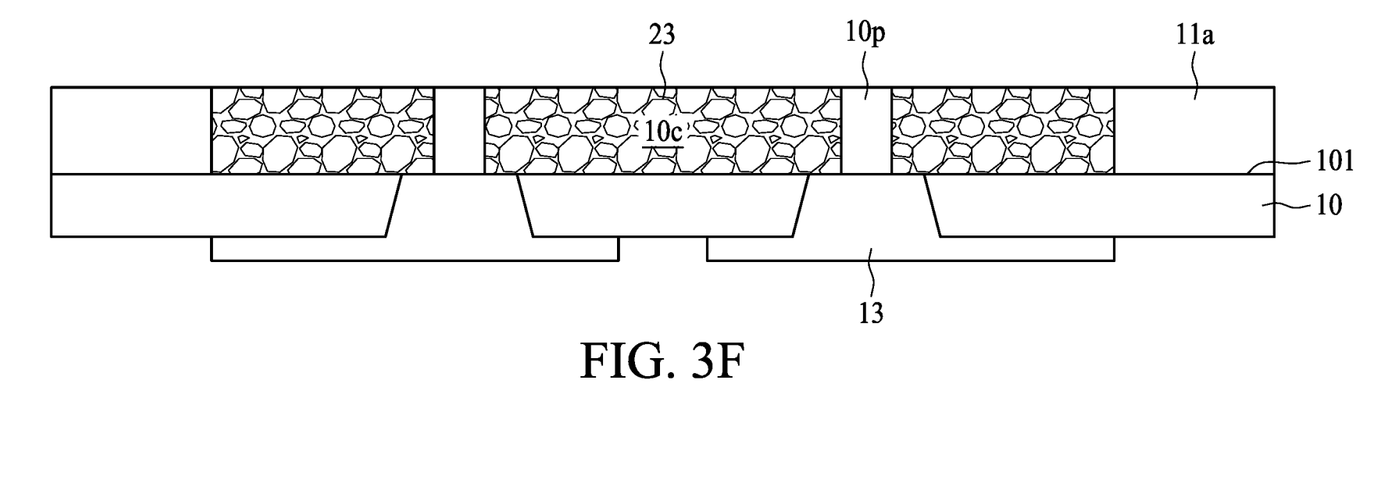

Referring to FIG. 3E, conductive elements 10p are formed within the openings 39ph defined by the patterned photoresist 39p1 by, for example, wet process. The patterned photoresist 39p1 is removed. Then, a dielectric layer 11a is formed on the surface 101 of the substrate 10. The dielectric layer 11a and the surface 101 of the substrate 10 define a cavity 10c. In some embodiments, a foaming agent 23 is then filled within the cavity 10c as shown in FIG. 3F.

Figure 4A:
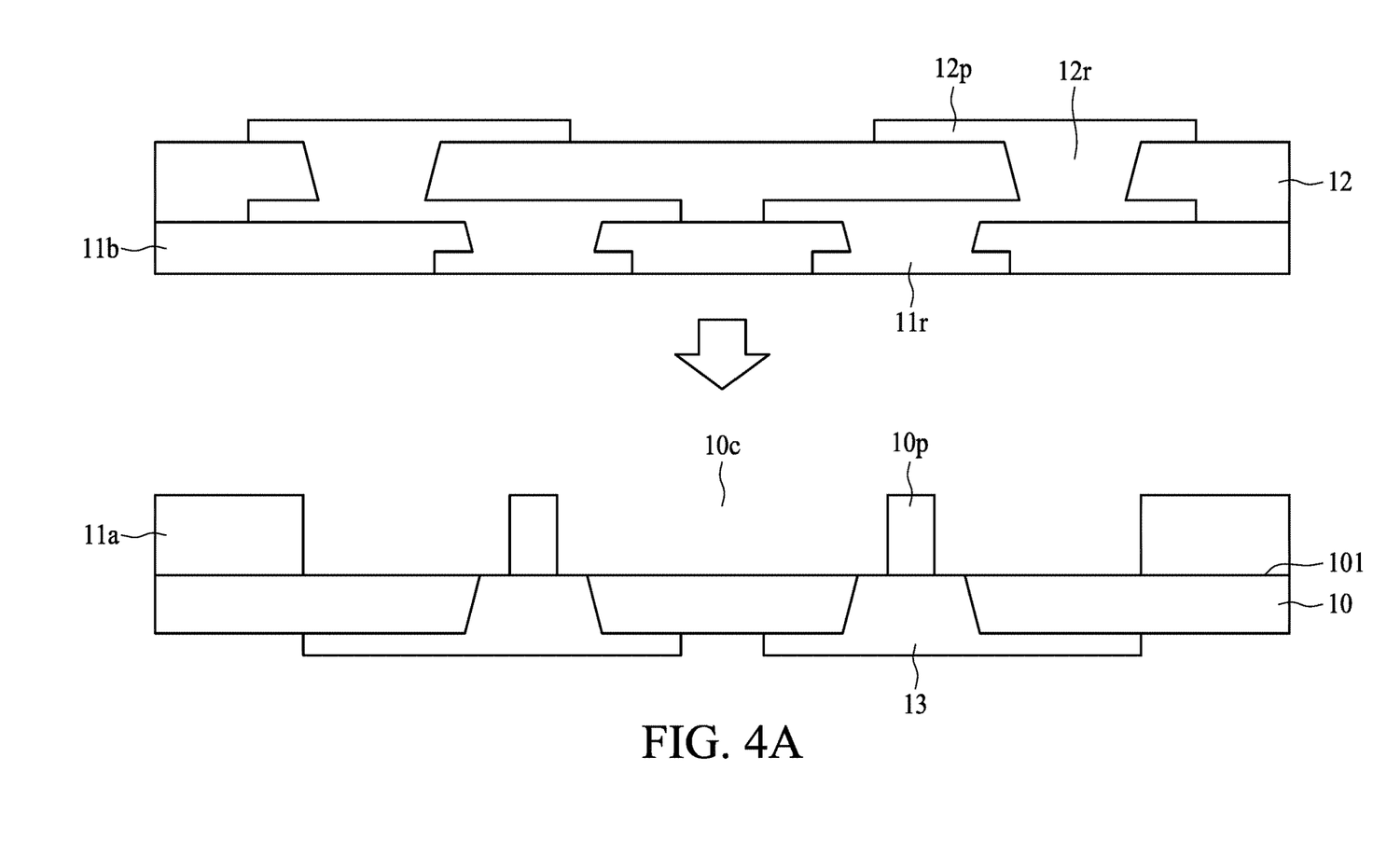
FIG. 4A, FIG. 4B and FIG. 4C illustrate a semiconductor manufacturing method in accordance with some embodiments of the present disclosure.
Figure 4B:
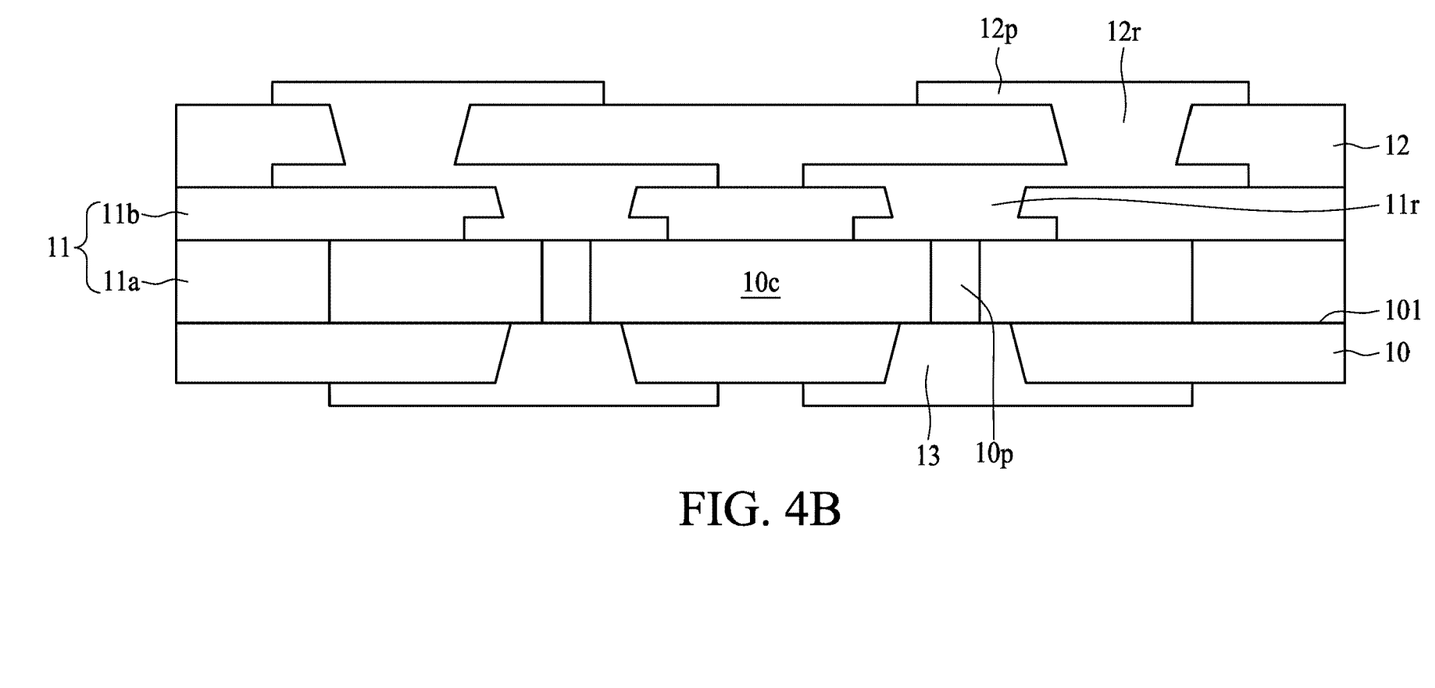
Figure 4C:
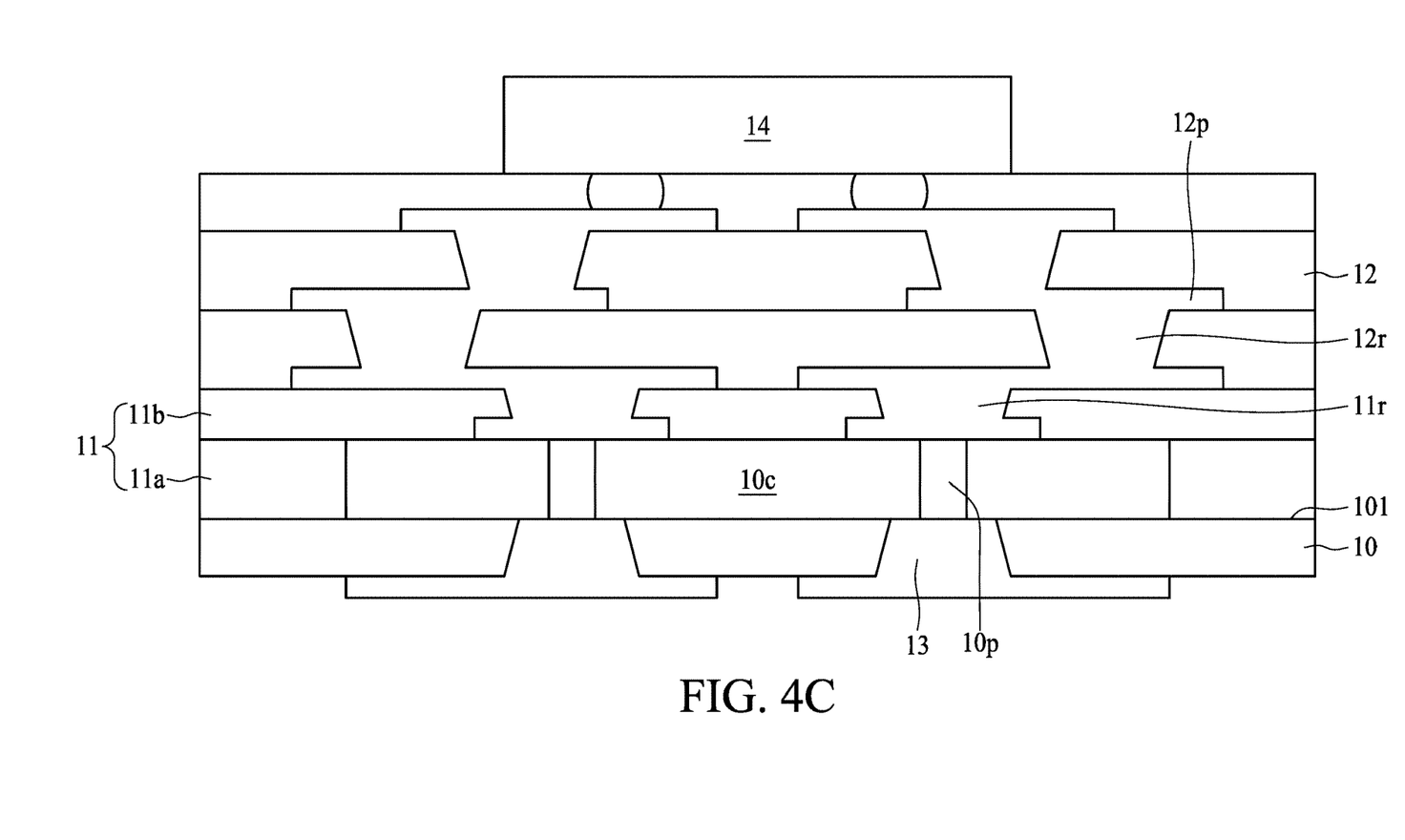

FIG. 4A, FIG. 4B and FIG. 4C illustrate a semiconductor manufacturing method in accordance with some embodiments of the present disclosure. In some embodiments, the method illustrated in FIG. 4A, FIG. 4B and FIG. 4C are used to manufactured the semiconductor device package 1 in FIG. 1.

Referring to FIG. 4A, the structure as shown in FIG. 3E and a dielectric layer 11b with a substrate 12 thereon are provided. A first temperature is provided to the dielectric layer 11a to heat (or soft bake or precure) the dielectric layer 11a (e.g., soft baking process or procuring process). A second temperature is provided to the dielectric layer 11b to heat (or soft bake or precure) the dielectric layer 11b (e.g., soft baking process or procuring process). In some embodiments, the first temperature can be equal to, greater than or less than the second temperature depending on different design specifications.

Referring to FIG. 4B, the dielectric layer 11b is attached to the dielectric layer 11a. Then, a third temperature is provided to the dielectric layers 11a and 11b to heat (hard bake or full cure) the dielectric layers 11a and 11b (e.g., hard baking process or full curing process), so that the dielectric layer 11a is bonded to the dielectric layer 11b. In accordance with the embodiments in FIG. 4B, the dielectric layer 11a is connected to the dielectric layer 11b through chemical bond, which can provide a better bond strength between the dielectric layer 11a and the dielectric layer 11b.

Referring to FIG. 4C, an electronic component 14 is disposed on the substrate 12. The electronic component 14 is electrically connected to the conductive pads 12c of the substrate 12. In some embodiments, electrical contacts 15 may be disposed on the substrate 12, and then a package body 16 can be formed on the substrate 12 to form the semiconductor device package 1 as shown in FIG. 1.

Figure 5A:
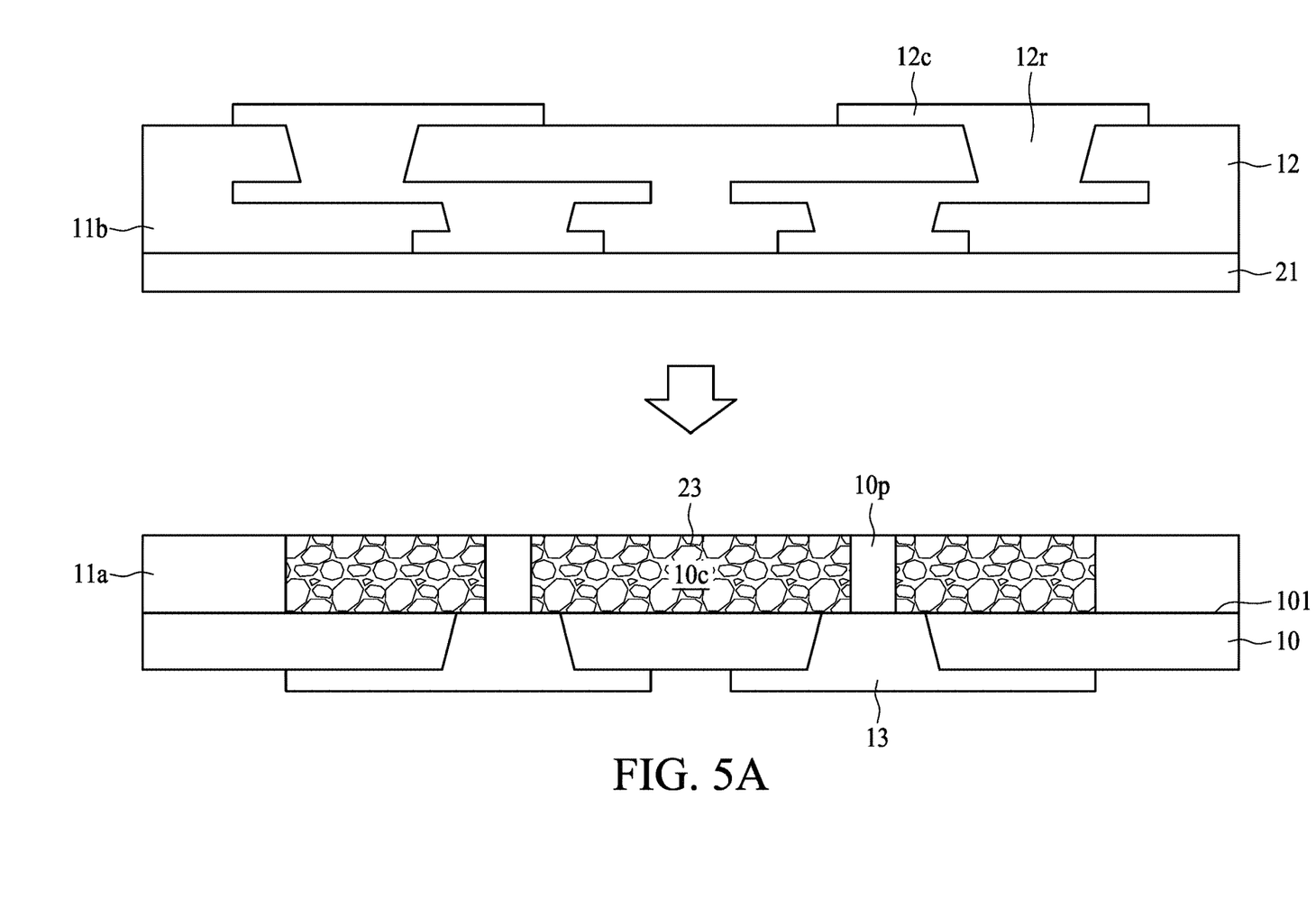
FIG. 5A, FIG. 5B and FIG. 5C illustrate a semiconductor manufacturing method in accordance with some embodiments of the present disclosure.
Figure 5B:
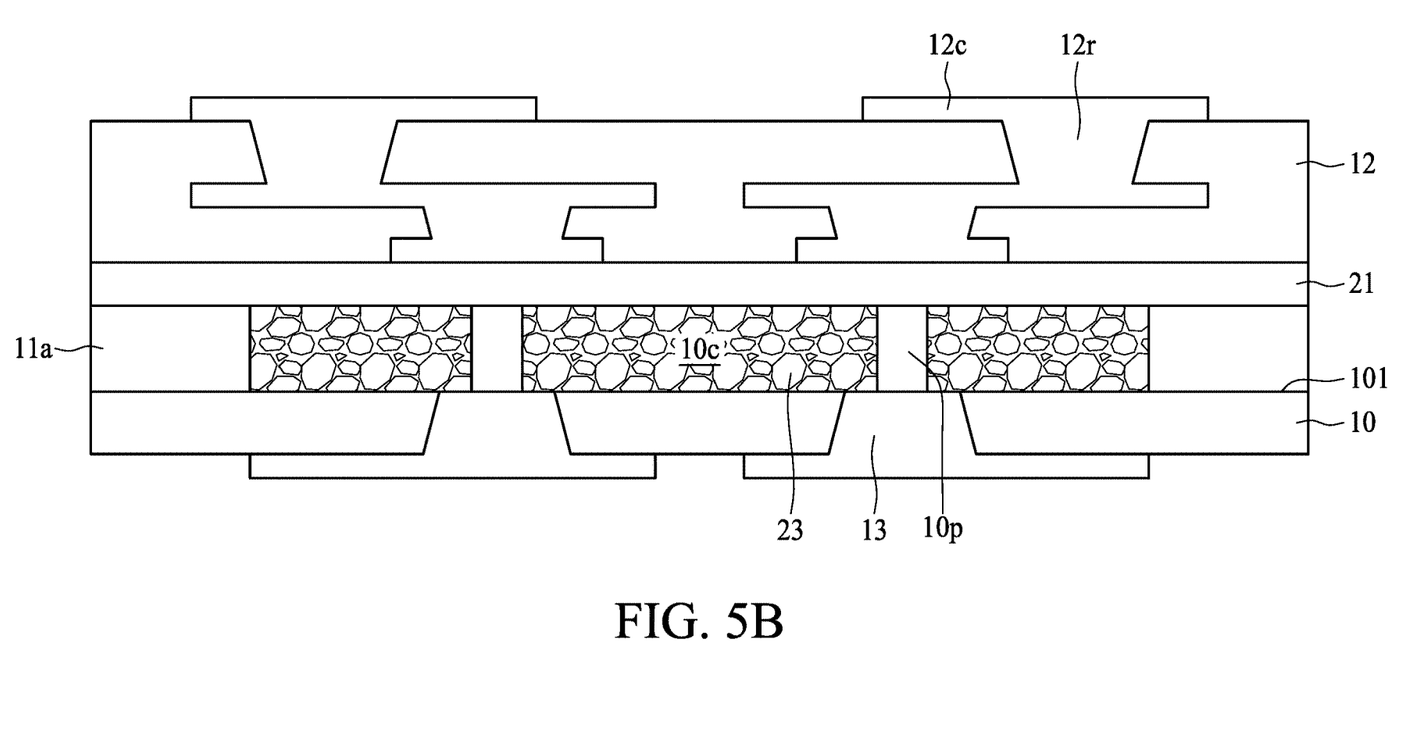
Figure 5C:
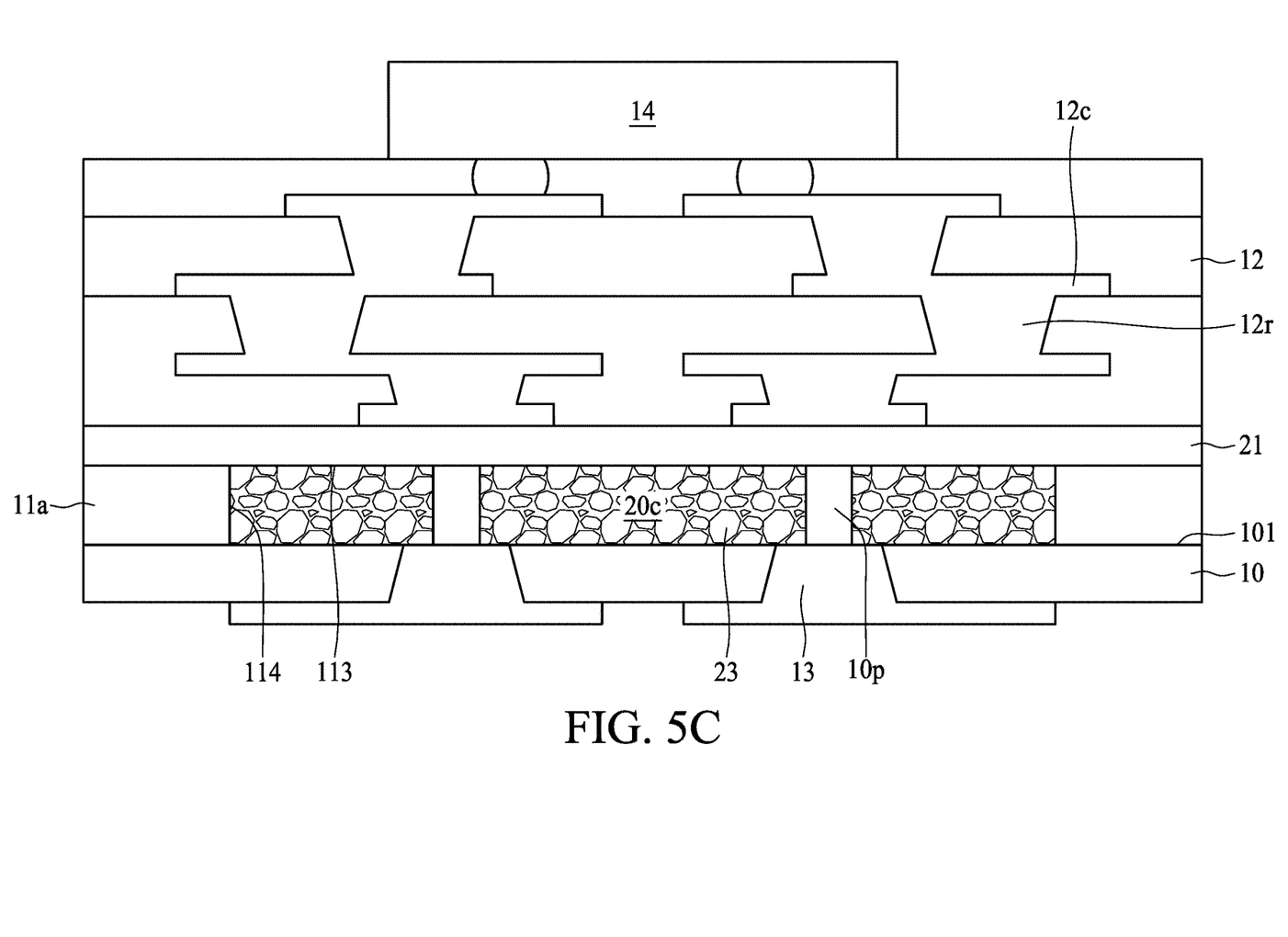

FIG. 5A, FIG. 5B and FIG. 5C illustrate a semiconductor manufacturing method in accordance with some embodiments of the present disclosure. In some embodiments, the method illustrated in FIG. 5A, FIG. 5B and FIG. 5C are used to manufactured the semiconductor device package 2 in FIG. 2.

Referring to FIG. 5A, the structure as shown in FIG. 3F and a substrate 12 with an adhesion layer 21 are provided. The substrate 12 is then attached to the dielectric layer 11a through the adhesion layer 21 as shown in FIG. 5B.

Referring to FIG. 5C, an electronic component 14 is disposed on the substrate 12. The electronic component 14 is electrically connected to the conductive pads 12c of the substrate 12. In some embodiments, electrical contacts 15 may be disposed on the substrate 12, and then a package body 16 can be formed on the substrate 12 to form the semiconductor device package 2 as shown in FIG. 2.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a first substrate having a first surface and a second surface opposite to the first surface;
an antenna element disposed on the second surface of the first substrate;
a second substrate disposed on the first surface of the first substrate, wherein a cavity is defined between the first substrate and the second substrate; and
a dielectric material disposed within the cavity,
wherein a portion of the antenna element penetrates the first substrate and electrically connected to the second substrate through a conductive element, and
wherein the conductive element is disposed within the cavity.

2. The semiconductor device package of claim 1, further comprising a support element disposed between the first substrate and the second substrate and surrounding the dielectric material.

3. The semiconductor device package of claim 2, further comprising an adhesion layer disposed between the support element and the second substrate.

4. The semiconductor device package of claim 1, further comprising an integrated circuit (IC) disposed on the second substrate.

5. The semiconductor device package of claim 3, wherein a dielectric constant (Dk) and a dissipation factor (Df) of a material of the dielectric material are less than Dk and DF of the adhesion layer.

6. The semiconductor device package of claim 5, wherein Dk of the material of the dielectric material is equal to or less than 3, and Df of the material of the dielectric material is equal to or less than 0.001.

7. The semiconductor device package of claim 1, wherein the dielectric material includes a porous material.

8. A semiconductor device package, comprising:
a first substrate having a first surface and a second surface opposite to the first surface;
an antenna element disposed on the second surface of the first substrate;
a second substrate disposed on the first surface of the first substrate, wherein a cavity is defined between the first substrate and the second substrate; and
a dielectric material disposed within the cavity,
wherein a portion of the antenna element penetrates the first substrate and electrically connected to the second substrate through a conductive element,
wherein the antenna element is in contact with the dielectric material.

9. A semiconductor device package, comprising:
a first substrate having a first surface and a second surface opposite to the first surface;
an antenna element disposed on the second surface of the first substrate;
a support layer disposed on the first surface of the first substrate and at the periphery of the first surface of the first substrate, the support layer having a first surface facing away from the first substrate, the support layer including a dielectric material;
a dielectric layer disposed on the first surface of the support layer and spaced apart from the first substrate; and
a second substrate disposed on a first surface of the dielectric layer facing away from the support layer, wherein
the dielectric layer further includes a second surface opposite to the first surface of the dielectric layer;
the support layer includes an inner surface;
the inner surface of the support layer, the second surface of the dielectric layer and the first surface of the first substrate define a cavity filled by a foaming agent;
the antenna element penetrates the first substrate and is electrically connected to the second substrate through a conductive element; and
wherein the conductive element is disposed within the cavity.

10. The semiconductor device package of claim 9, further comprising an integrated circuit (IC) disposed on the second substrate.

11. The semiconductor device package of claim 9, wherein the foaming agent is surrounded by the support layer.

12. The semiconductor device package of claim 9, wherein the conductive element is surrounded by the support layer.

13. The semiconductor device package of claim 9, wherein a dielectric constant (Dk) and a dissipation factor (Df) of a material of the foaming agent are less than Dk and DF of dielectric materials.

14. The semiconductor device package of claim 13, wherein Dk of the material of the foaming agent is equal to or less than 3, and Df of the material of the foaming agent is equal to or less than 0.001.

15. The semiconductor device package of claim 9, wherein the support layer and the antenna element are physically separated from each other.

* * * * *